US008885852B2

(12) United States Patent
Kim

(10) Patent No.: US 8,885,852 B2

(45) Date of Patent: Nov. 11, 2014

(54) AUDIO CONTROL SYSTEM

(75) Inventor: Seungil Kim, Seoul (KR)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 13/121,322

(22) PCT Filed: Dec. 22, 2010

(86) PCT No.: PCT/US2010/061819
§ 371 (c)(1),
(2), (4) Date: Mar. 28, 2011

(87) PCT Pub. No.: WO2012/087314
PCT Pub. Date: Jun. 28, 2012

(65) Prior Publication Data

US 2013/0259247 A1 Oct. 3, 2013

(51) Int. Cl.

| | |
|---|---|
| ***H03G 3/00*** | (2006.01) |
| ***G10K 11/16*** | (2006.01) |
| ***H04R 1/10*** | (2006.01) |

(52) U.S. Cl.
CPC .............. *G10K 11/16* (2013.01); *H04R 1/1041* (2013.01)
USPC ................. 381/104; 381/66; 381/74; 381/92; 379/406.01; 455/114.2

(58) Field of Classification Search
CPC ........... H04R 2225/43; H04R 2225/49; H04R 2225/61; H04R 2227/001; H04R 2227/007; H04R 2227/009; H04R 2400/01; H04R 2410/01; H04R 2410/05; H04R 2410/07; H04R 2430/01; H04R 2460/05; H04R 2499/11; H04R 2499/13; H04R 5/04; H04R 3/002; H04R 3/02; H04R 1/1041; H04R 1/1083; H04R 1/1091; H04R 25/453; H04R 25/502; H04R 25/505; H04R 27/02; H04R 2201/10; H04R 2225/59; H04R 2440/01; G10K 2210/1081; G10K 2210/1082; G10K 2210/123; G10K 2210/3014; G10K 2210/3017; G10K 2210/3021; G10K 2210/30231; G10K 2210/3022; G10K 2210/30232; G10K 2210/3035; G10K 2210/30351; G10K 2210/3047; G10K 2210/3054; G10K 2210/3055; G10K 2210/3226; G10K 2210/504; G10K 2210/505; G10K 2210/506; G10L 2021/02; G10L 2021/02082; G10L 2021/02085; G10L 2021/02087; G10L 2021/02163; G10L 2021/02165
USPC ............. 381/71.1–71.9, 71.11, 71.12, 92, 93, 381/94.1, 94.7, 94.8, 95, 96, 66, 104, 105, 381/106, 109, 110, 120, 28, 74; 379/406.01, 406.02, 406.03, 406.04, 379/406.06, 406.07, 406.08, 406.09, 379/406.11, 406.15, 406.16; 455/570, 455/114.2; 704/E19.014, E21.002, 704/E21.007; 700/94
See application file for complete search history.

(56) References Cited

U.S. PATENT DOCUMENTS 4,823,382 A * 4/1989 Martinez .................. 379/406.08
5,675,658 A 10/1997 Brittain (Continued)

OTHER PUBLICATIONS

"An Augmented Reality Audio Headset" M. Tikander et al., Proc. of the 11$^{th}$ Int. Conference on Digital Audio Effects (DAFx-08), Espoo, Finland, Sep. 1-4, 2008, pp. DAFX-1-DAFX-4.

(Continued)

*Primary Examiner* — Leshui Zhang

(74) *Attorney, Agent, or Firm* — Brundidge & Stanger, P.C.

(57) ABSTRACT

Technologies are generally described for a system for controlling an audio signal based on a proximity of, e.g., a user's hand to at least one component of an audio control system. In some examples, an audio control system may include a filter configured to provide an echo signal and a control decision unit configured to provide a control signal based on the echo signal.

29 Claims, 9 Drawing Sheets

(56) References Cited

U.S. PATENT DOCUMENTS

| | | | | |
|---|---|---|---|---|
| 6,839,427 | B2 | 1/2005 | Tahernezhaadi et al. | |
| 6,967,946 | B1 | 11/2005 | Tackin et al. | |
| 7,006,624 | B1 * | 2/2006 | Philipsson et al. | 379/388.03 |
| 7,769,162 | B2 | 8/2010 | Knutson et al. | |
| 7,834,850 | B2 | 11/2010 | Boillot et al. | |
| 2007/0211023 | A1 * | 9/2007 | Boillot | 345/156 |
| 2007/0258579 | A1 | 11/2007 | Hirai et al. | |

OTHER PUBLICATIONS

International Search Report and Written Opinion for International Application No. PCT/US2010/061819, ISA/US, mailed on Feb. 28, 2011.

* cited by examiner

*FIG. 8*

| First control signal | Second control signal | Operations of Spearkers |
|---|---|---|
| 0 | 0 | 1st Operation |
| 0 | 1 | 2nd Operation |
| 1 | 0 | 3rd Operation |
| 1 | 1 | 4th Operation |

AUDIO CONTROL SYSTEM

BACKGROUND

Audio control systems generally provide for the control of audio signals. The size and type of the audio control systems vary widely from large-scale systems suitable for use in concert halls to small-scale systems suitable for use in headsets. Recent audio control systems tend to implement more advanced functions, such as noise cancelling and echo cancelling. The advancement of the functions and features included in audio control systems has brought about a demand for more intuitive and user-friendly audio control system controls.

SUMMARY

In an example, an audio control system may include a filter configured to receive a signal from an audio player and to provide an echo signal based on the received signal, and a control decision unit configured to provide a control signal based on the echo signal.

In another example, an audio control system may include a first filter configured to receive a first signal from a first speaker and to provide a first echo signal based on the received first signal, a second filter configured to receive a second signal from a second speaker and to provide a second echo signal based on the received second signal, a control decision unit configured to provide a first control signal based on the first echo signal and to provide a second control signal based on the second echo signal, and a controller configured to control the operation of the first speaker according to at least one of the first and second control signals and at least one functional feature of the second speaker according to at least one of the first and second control signals.

In yet another example, an audio control system may include a speaker, a microphone, a filter configured to receive a signal from the speaker and to provide an echo signal based on the received signal, a control decision unit configured to provide a control signal based on the echo signal, and a controller configured to control the operation of the speaker according to the control signal.

In still another example, a method performed under the control of an audio control system may include receiving an echo signal from a filter, determining a control signal based on the echo signal, and controlling the operation of a speaker according to the control signal.

In a further example, a computer-readable storage medium may include contents that, when executed by a processor, cause the processor to receive an echo signal from a filter, determine a control signal based on the echo signal, and control the operation of a speaker according to the control signal.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the embodiments will be described with additional specificity and detail through use of the accompanying drawings, in which:

FIG. 8 shows an illustrative example of controlling the operation of speakers according to a first control signal and a second control signal.

DETAILED DESCRIPTION

Figure 1:
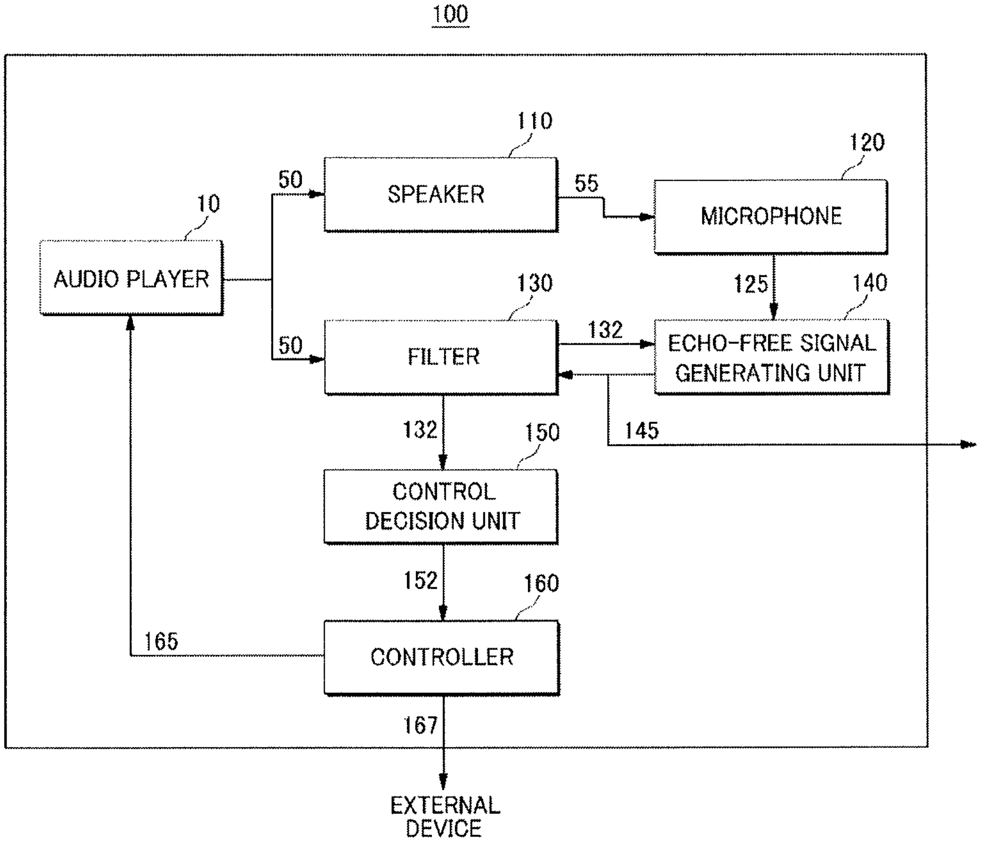
FIG. 1 shows a schematic block diagram of an illustrative example of an audio control system.

In the following detailed description, reference is made to the accompanying drawings, which form a part of the present disclosure. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the drawings, can be arranged, substituted, combined, separated, and designed in a wide variety of different configurations, all of which are explicitly contemplated herein.

This disclosure is generally drawn, inter alia, to methods, apparatus, systems, devices, and computer program products related to audio control systems.

Presently, technologies are generally described for an audio control system for controlling an audio signal. In the example embodiments described herein, the system may include various permutations of at least one of a filter to provide an echo signal, a control decision unit to provide a control signal based on the echo signal, and a controller to control the operation of a speaker according to the control signal.

In the following examples, one or more embodiments of the audio control system described herein may be used by a user to control the operation of an audio system based on an echo signal. In at least one example embodiment, an audio control system may include a speaker configured to output a sound (corresponding to an audio signal) and a microphone configured to detect the sound of a user's voice to provide a microphone signal. The microphone signal may include an echo component that corresponds to the speaker's sound that is picked up by the microphone, and the echo signal that is used to control operation of the audio control system may be influenced by the echo component of the microphone signal.

More particularly, the aforementioned echo signal may be varied by the behavior of the user of the audio control system.

By way of example, when the audio control system is reproducing an audio file, the user may place his/her hand in proximity of the audio control system to partially or completely cover at least one of the speaker and the microphone. This action may cause the magnitude of the echo signal to increase as the magnitude of a signal reflected by the user's hand back to the microphone increases. Similarly, when the user moves his/her hand away from the audio control system, the magnitude of the echo signal may decrease. Subsequently, the increase or decrease of the magnitude of the aforementioned echo signal may be translated into a control signal that may be used to control the operation of the audio control system. Examples of such control over the operation of the audio control system include controlling the speaker volume and even controlling the selection of a reproduced audio file to be output to the speaker.

FIG. 1 shows a schematic block diagram of an illustrative example of an audio control system in accordance with at least some embodiments described herein. Referring to FIG. 1, an audio control system 100 may include an audio player 10, a speaker 110, a microphone 120, a filter 130, an echo-free signal generating unit 140, a control decision unit 150, and a controller 160.

Audio player 10 may output an audio signal. For example, audio player 10 may play an audio file to provide an audio signal or a sequence of audio signals (collectively referred to herein as audio signal 50) to speaker 110 and filter 130. In at least one embodiment, audio player 10 may receive an audio signal (not shown) from a source or speaker other than the user of the audio control system 100, and it is the received audio signal that audio player 10 forwards to speaker 110 and filter 130 as the aforementioned audio signal 50.

Speaker 110 may output a sound 55. As shown in the example of FIG. 1, speaker 110 may receive the audio signal 50 from audio player 10, and output a sound 55 corresponding to the audio signal 50. Speaker 110 may include, but not be limited to, a headphone speaker, an earphone speaker, or a speaker included in a mobile communication device.

The sound 55 output by speaker 110 may be detected or picked up by microphone 120, as illustrated in FIG. 1.

Microphone 120, in addition to receiving sound 55 output by speaker 110, may detect a sound from an ambient environment around microphone 120 and output a microphone signal 125. By way of example, audio control system 100 may be used for two-way communication between a user of the audio control system 100 and source or speaker other than the user of the audio control system 100, between which communication may be implemented via a communication network (not shown in FIG. 1).

Continuing with the example of FIG. 1, speaker 110 may output a sound detected from the source or speaker other than the user of the audio control system 100, and the sound 55 output from speaker 110 may be inadvertently picked up by microphone 120 together with the sound from the user of the audio control system 100. In such a case, the microphone signal 125 may correspond to both the sound 55 output from speaker 110 as well as the signal influenced by the sound detected from the user of the audio control system 100.

Then, the microphone signal 125 may be transmitted to the source or speaker other than the user of the audio control system 100, and the source or speaker other than the user of the audio control system 100 may then hear the sound originally detected from there. This phenomenon is well-known and is commonly referred to as an echo phenomenon or a howling phenomenon, which includes the speaker 110 re-transmitting the sound originally output from the speaker 110 in combination with a sound detected from the user of the audio control system 100. The echo, or howling, phenomenon may occur when the speaker 110 and microphone 120 are arranged or positioned to be in close proximity to each other, or the magnitude of a sound output from speaker 110 is large enough for microphone 120 to detect the sound output from speaker 110.

In the following description, the signal corresponding to the sound 55 output from speaker 110, which is included in the microphone signal 125, may alternatively be referred to as an echo component. When the echo, or howling, phenomenon occurs, communication between the user of the audio control system 100 and the source or speaker other than the user of the audio control system 100 may be disturbed. In order to avoid the echo phenomenon, audio control system 100 may include software or hardware modules such as filter 130 and echo-free signal generating unit 140.

Filter 130 may receive the signal 50 from audio player 10 and provide an echo signal 132, based on the received signal 50, to control decision unit 150. As shown in the example of FIG. 1, filter 130 may filter the signal 50 received from audio player 10 based on a filtering coefficient to provide the echo signal 132. Filter 130 may further receive an echo-free signal 145 from echo-free signal generating unit 140 as a feedback signal, and update the filtering coefficient utilized by filter 130 based on the echo-free signal to provide a more accurate echo signal. Then, filter 130 may provide the echo signal 132 to control decision unit 150. In some embodiments, filter 130 may provide the filtering coefficient to control decision unit 150. Further, filter 130 may provide the echo signal 132 to echo-free signal generating unit 140 to generate an echo-free signal 145.

More particularly, echo-free signal generating unit 140 may receive the microphone signal 125 from microphone 120 and the echo signal 132 from filter 130. Echo-free signal generating unit 140 may then provide an echo-free signal 145 based on the microphone signal 125 and the echo signal 132. By way of example, echo-free signal generating unit 140 may eliminate the echo component included in the microphone signal 125 by subtracting the echo signal 132 from the microphone signal 125 to provide the echo-free signal 145. Further, echo-free signal generating unit 140 may provide filter 130 with the echo-free signal 145 as a feedback signal so that filter 130 may update the filtering coefficient utilized by filter 130, as described above.

The echo signal 132 may vary depending on, but not limited to, the physical arrangement of speaker 110 relative to microphone 120, including the distance in-between, or the characteristics of the sound 55 output from speaker 110. Further, the echo signal 132 may also be varied by an object (for example, a hand of a user) being placed around speaker 110 and/or microphone 120 to partially or completely cover speaker 110 and/or microphone 120.

Control decision unit 150 may provide controller 160 with control signal 152. For example, control decision unit 150 may receive the echo signal 132 from filter 130, and provide the control signal 152, based on the received echo signal, to controller 160. The control signal 152 may be related to, or based on, one or more characteristics of the echo signal 132. By way of example, the control signal 152 may be related to the magnitude of the echo signal, as will be explained below. In some embodiments, control decision unit 150 may receive the filtering coefficient from filter 130, and provide the control signal 152, based on the received filtering coefficient, to controller 160.

Controller 160 may control the operation of speaker 110 based on the control signal 152 provided by control decision unit 150. For example, controller 160 may control the volume of speaker 110 based on the control signal 152. More particularly, since it is natural for a user of audio control system 100 to place his/her hand close to his/her ear to accurately hear sounds that may be characterized as quiet, low-volume, small, or even delicate, the embodiments described herein exploit such behavior to generate control signal 152, e.g., for volume control. More particularly, as the user of the audio control system 100 moves his/her hand sufficiently close to the speaker 110, the echo signal 132 may increase, thus generating values of the control signal 152 that cause the volume of speaker 110 to increase in proportion to the proximity of the user's hand to speaker 110. Alternatively, as the user of the audio control system 100 removes his/her hand from the speaker 110, the echo signal 132 may decrease, thus generating values of the control signal 152 that cause the volume of speaker 110 to decrease in proportion to the increasing distance of the user's hand from speaker 110. It will be apparent to those skilled in the art that various controls to the operation of speaker 110 are available based on the shape of control signal 152.

Further, controller 160 may control the operation of an external device, via signal 167. The external device may provide a wireless and/or wired connection to audio control system 100. By way of example, the external device may include, but not limited to, a mobile telecommunication terminal, or a portable media player. Audio control system 100 may receive an audio signal from the external device and reproduce the received audio signal. In this case, filter 130 may generate an echo signal based on the audio signal, control decision unit 150 may generate a control signal based on the echo signal, and controller 160 may control the operation of the external device based on the control signal. The control signal may be a wireless signal, but not limited thereto.

Figure 2:
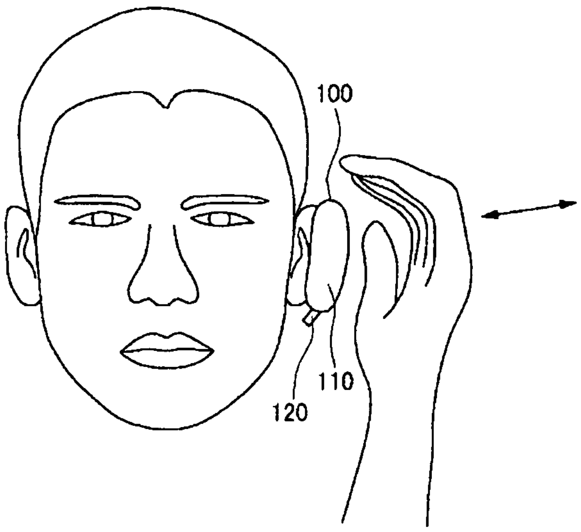
FIG. 2 shows an illustrative example of a user varying an echo signal.

FIG. 2 shows an illustrative example of a user varying an echo signal in accordance with one or more embodiments of an audio control system, as presently described. As depicted in FIG. 2, a user of audio control system 100 may place or wear audio control system 100 on one ear, and vary the echo signal by placing his/her hand in the proximity of audio control system 100 to partially or completely cover audio control system 100. Moreover, by placing the hand nearer or further from audio control system 100, the user can partially cover audio control system 100 to varying degrees. For example, when the user moves his/her hand closer to audio control system 100, the magnitude of the echo signal increases because the magnitude of a signal reflected by the user's hand back to microphone 120 increases. Similarly, when the user moves his/her hand further away from audio control system 100, the magnitude of the echo signal decreases. Naturally, when the user's hand covers audio control system 100 completely, the magnitude of the echo signal would be greater than the magnitude of an echo signal generated when the user's hand is not completely covering audio control system 100, e.g., user's hand is positioned any distance away from audio control system 100.

In the example above, although it has been described that the echo signal is varied by the placement of the user's hand relative to one or more components of audio control system 200, it will be apparent to those skilled in the art that the echo signal may be varied by other means. For instance, in accordance with one or more embodiments of an audio control system, a user who is wearing audio control system 100 on one ear, e.g., the right ear, may move his/her head toward his/her right shoulder so that the right shoulder is positioned closer to audio control system 100. Then, the magnitude of the echo signal increases because the magnitude of a signal reflected by the user's shoulder back to microphone 120 increases. In some embodiments, the echo signal may be varied when the user wearing audio control system 100 enters into a place where a sound resonance easily occurs, such as in a tunnel and a cave.

Figure 3:
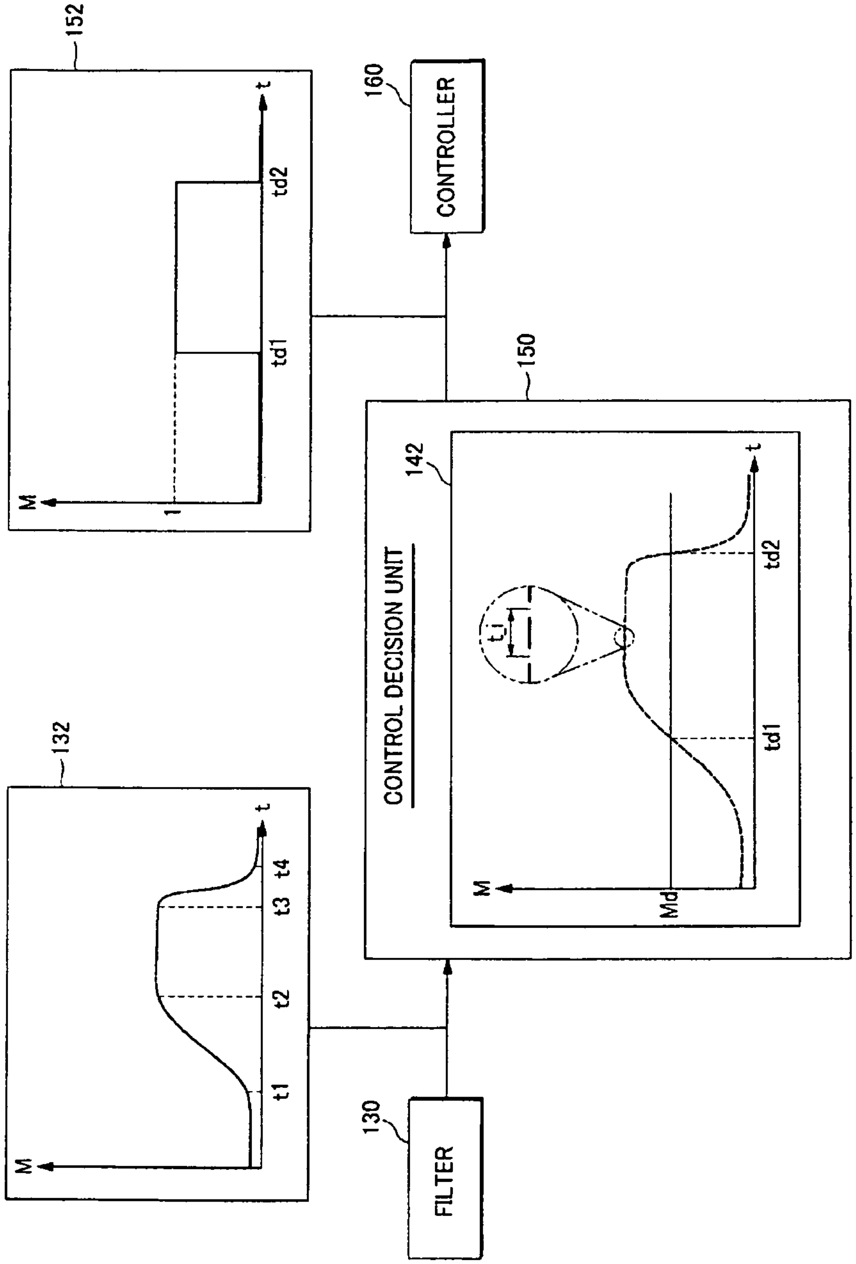
FIG. 3 shows an illustrative example of an echo signal provided by a filter and a control signal provided by a control decision unit.

FIG. 3 shows an example of the echo signal 132 provided by filter 130 and the control signal 152 provided by control decision unit 150 in accordance with one or more embodiments of an audio control system, as described herein.

As depicted in FIG. 3, control decision unit 150 provides a control signal 152 based on an echo signal 132 received from filter 130. As discussed above with reference to FIG. 2, echo signal 132 may be varied by various means including the positioning of a user's hand around components of audio control system 100. In the example of FIG. 3, at time t1, the user's hand may be positioned sufficiently close to audio control system 100 to generate an echo signal 132. Subsequently, the magnitude of the echo signal 132 may increase from time t1, as the user's hand moves closer to audio control system 100, until time t2, at which point the user's hand completely covers speaker 110 and/or microphone 120. Then, at time t3, the magnitude of the echo signal 132 may decrease as the user's hand moves away from audio control system 100; and, at time t4, the user's hand may be positioned sufficiently away from audio control system 100 so that the echo signal 132 is no longer generated.

As shown in FIG. 3, control decision unit 150 may measure the average magnitude of the echo signal 132 during a predetermined time interval of t_i. Each dot of the dotted line of a signal 142, highlighted in the magnified portion of the figure, represents the average magnitude of the echo signal 132 during a predetermined time interval of t_i. For example, control decision unit 150 may compare each of the measured average magnitudes with a predetermined value of Md, and provide a control signal 152, based on the comparison result, to controller 160. The control signal 152 may be provided as a binary signal that represents two states, i.e., 1 and 0. As depicted in FIG. 3, the average magnitude of the echo signal may increase beyond the predetermined value of Md at time td1, and may decrease below the predetermined value of Md at time td2. Accordingly, control decision unit 150 may output control signal 152, which may vary from 0 to 1 at time td1 and may vary from 1 to 0 at time td2. As set forth above, control signal 152 may then be output from control decision unit 150 to controller 160.

In the example above, although control signal 152 is described as being based on the average magnitude of the echo signal 132, the embodiments described in the present disclosure are not limited thereto. In some embodiments, control decision unit 150 may measure the average power of the echo signal during a predetermined time interval. The average power may be calculated by averaging the square of the magnitude of the echo signal measured during a predetermined time interval. Then, control decision unit 150 may compare the measured average power of the echo signal with a predetermined value and provide a control signal, based on the comparison result, to controller 160. Since the average power of the echo signal may exhibit a greater variation as compared to the average magnitude of the echo signal, using the average power may be beneficial when the echo signal 132 is weak and the magnitude of the echo signal is small.

Figure 4:
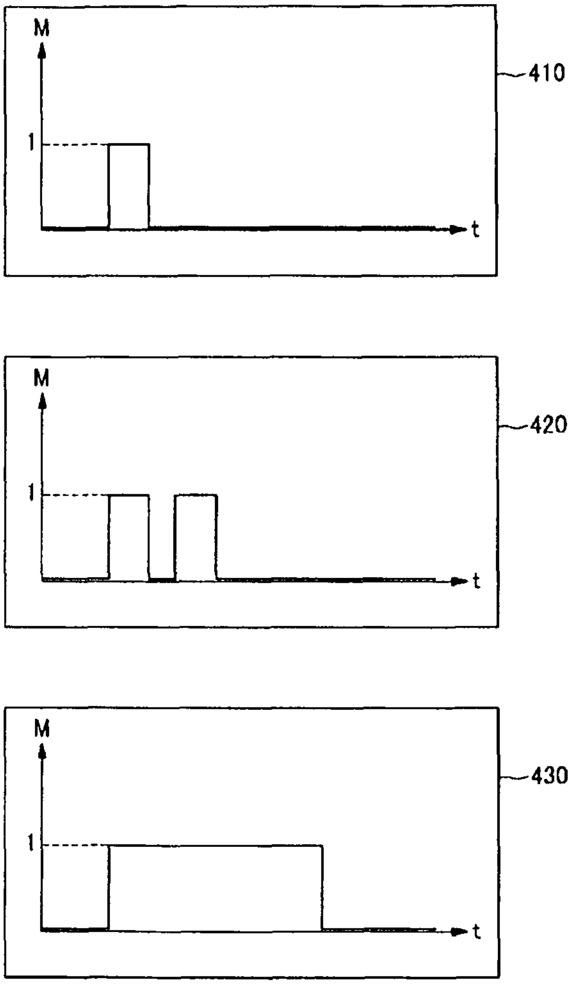
FIG. 4 shows an illustrative example of various control signals provided by a control decision unit.

FIG. 4 shows an illustrative example of various control signals provided by control decision unit 150 in accordance with one or more of the embodiments described herein. Control signal 410 is a first example of these various control signals, having a shape of one narrow rectangle, i.e., the duration of control signal 410 is relatively short, e.g., about 1 second, and may be used by controller 160 to increase the volume of speaker 110 by a predetermined amount, dependent upon the proximity of, e.g., the user's hand to the speaker 110 of audio control system 100. Alternatively, control signal 420, which is another example of the aforementioned various control signals, has a shape of two consecutive narrow rectangles, i.e., two short control signals occurring in a short interval, e.g., about 0.5 seconds, may be used by controller 160 to decrease the volume of speaker 110 by a predetermined amount, dependent upon the distance upon which, e.g., the user's hand has been removed from the speaker 110 of audio control system 100. Control signal 430, which is yet another example of the various control signals, has a shape of one wide rectangle, i.e., the duration of control signal 410 is relatively long, e.g., more than 5 seconds, may cause controller 160 to mute the volume of speaker 110, dependent upon a designated action taken by the user relative to the speaker 110 of audio control system 100. These examples of the control signals and their corresponding operations, or functional features, are illustrative only, and many modifications and variations may be made within the spirit and scope of the present disclosure.

In the examples described above with reference to FIG. 1 and FIG. 4, it will be apparent that controller 160 may control features and functions of speaker 110 other than just the volume.

For example, controller 160 may change the audio signal, or audio file, to be output from speaker 110. For instance, audio player 10 may play a list of audio files in consecutive order. While audio player 10 is playing an audio file in the list, controller 160 may provide audio player 10 with control signal 152 that causes a change in the audio file output from speaker 110. In such a case, according to the duration of control signal 152, i.e., the time interval between time td1 and time td2, various controls to audio player 10 may be available. For example, if the duration of control signal 152 is relatively short, e.g., about 1 second, audio player 10 may cause the next listed audio file to be output from speaker 110; but if the duration of control signal 152 is relatively long, e.g., about 3 seconds, audio player 10 may cause the audio file at the end of the list to be output from speaker 110. Even further, if the duration of control signal 152 is very long, e.g., more than 10 seconds, audio player 10 may stop playing the listed audio files altogether.

Figure 5:
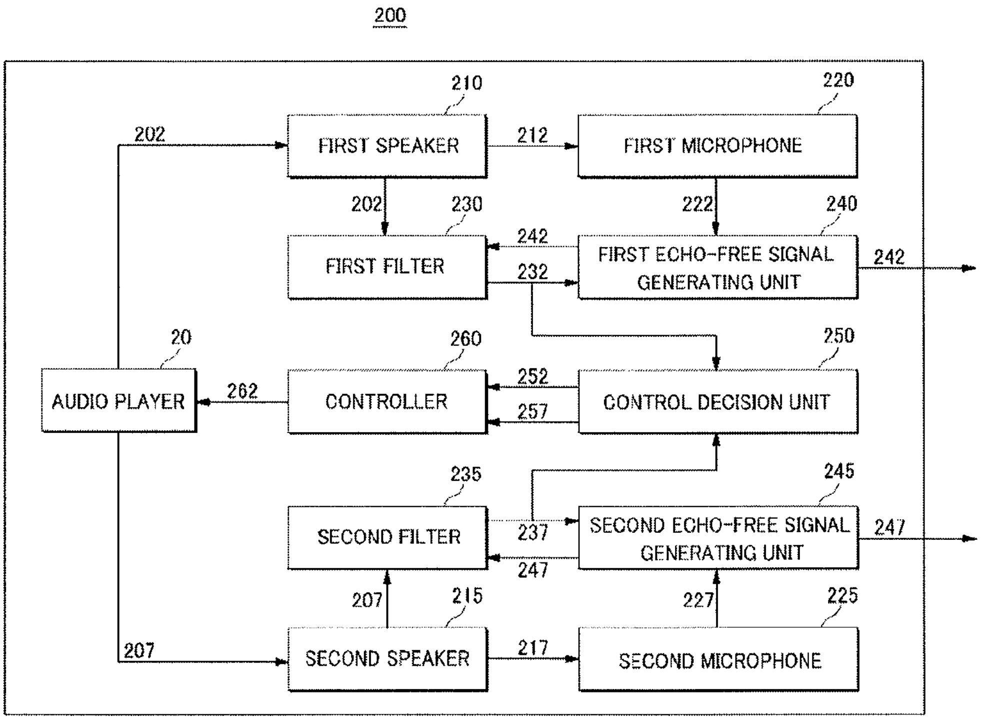
FIG. 5 shows a schematic block diagram of an illustrative example of an audio control system with two speakers.

FIG. 5 shows a schematic block diagram of an illustrative example of audio control system 200 having two speakers in accordance with at least some embodiments described herein. Audio control system 200 may include an audio player 20, a first speaker 210, a second speaker 215, a first microphone 220, a second microphone 225, a first filter 230, a second filter 235, a first echo-free signal generating unit 240, a second echo-free signal generating unit 245, a control decision unit 250, and a controller 260.

Audio player 20 may output an audio signal. For example, audio player 20 may play an audio file to provide a first audio signal 202 to first speaker 210 and to provide a second audio signal 207 to second speaker 215. The first audio signal 202 and the second audio signal 207 may be generated from the same audio file, but not all embodiments of an audio control system are so limited. Thus, according to one or more embodiments, audio player 20 may receive an audio signal from a source or speaker other than the user of the audio control system 200 and forward the received audio signal to first and second speakers 210 and 215 to reproduce the received audio signal.

First speaker 210 may receive the first audio signal 202 and produce a first sound 212 corresponding to the first audio signal 202, and second speaker 215 may receive the second audio signal 207 and produce a second sound 217 corresponding to the second audio signal 207. First speaker 210 and/or second speaker 215 may include, but not be limited to, a headphone speaker, an earphone speaker, or a speaker included in a mobile device. The first sound 212 produced by first speaker 210 may be detected or picked up by first microphone 220, and the second sound 217 produced by second speaker 215 may be detected or picked up by second microphone 225. Further, first and second speakers 210 and 215 may provide the first and second audio signals 202 and 207 to first and second filters 230 and 235, respectively.

First microphone 220, in addition to receiving first sound 212 output by first speaker 210, may detect a sound from an ambient environment around first microphone 220, and output a first microphone signal 222. More particularly, the first sound 212 from first speaker 210 may be picked up by first microphone 220, and the first microphone signal 222 may correspond to both the first sound 212 output from first speaker 210 as well as the sound detected from the ambient environment around audio control system 200. Similarly, second microphone 225 may also detect a sound from an ambient environment around second microphone 225, and output a second microphone signal 227. Accordingly, the second sound 217 output from second speaker 215 may be picked up by second microphone 225, and the second microphone signal 227 may correspond to both the second sound 217 output from second speaker 215 as well as the sound detected from the ambient environment around audio control system 200. In the following description, the signals corresponding to the sounds from speakers 210 and 215, which may be included in the first and second microphone signals, 222 and 227 respectively, may also be referred to as echo components.

First filter 230 may receive the first audio signal 202 from first speaker 210 and a first echo-free signal 242 from first echo-free signal generating unit 240 to provide a first echo signal 232 based on the received signals. Second filter 235 may receive the second audio signal 207 from second speaker 215 and a second echo-free signal 247 from second echo-free signal generating unit 245 to provide a second echo signal 237 based on the received signals. The first and second echo signals 232 and 237 may be varied independently, as will be described below with reference to FIG. 6.

First echo-free signal generating unit 240 may receive a first microphone signal 222 from first microphone 220 and a first echo signal 232 from first filter 230 to provide a first echo-free signal 242 based on the received signals. Second echo-free signal generating unit 245 may receive a second microphone signal 227 from second microphone 225 and a second echo signal 237 from second filter 235 to provide a second echo-free signal 247 based on the received signals. For example, each of first and second echo-free signal generating units 240 and 245 may eliminate the echo component included in the corresponding microphone signals 222 and 227 by subtracting the corresponding echo signals 232 and 237 from the corresponding microphone signals 222 and 227 to provide the corresponding echo-free signals 242 and 247. Then, first and second echo-free signal generating units 240 and 245 may provide first and second filters 230 and 235 with the first and second echo-free signals 242 and 247 as respective feedback signals, based on which first and second filters 230 and 235 may provide a more accurate echo signal, as described above with reference to FIG. 1.

Control decision unit 250 may provide a first control signal 252 and a second control signal 257 to controller 260. For example, control decision unit 250 may receive the first and second echo signals from first and second filters 230 and 235 and provide the first and second control signals 252 and 257, based on the received first and second echo signals 232 and 237 respectively, to controller 260. The first and second control signals 252 and 257 may be related to, or based on, one or more characteristics of the first and second echo signals 232 and 237 respectively. An example of such characteristic of the first and second echo signals is the respective magnitudes thereof.

Controller 260 may control the operation of first and second speakers 210 and 215, both individually and corporately, based on at least one of the first and/or second control signals 252 and 257 provided by control decision unit 250. For example, the first control signal 252 may control not only the operation of first speaker 210 but also that of second speaker 215; further, the second control signal 257 may control not only the operation of second speaker 215 but also that of first speaker 210. Detailed description thereof will be provided below with reference to FIG. 8.

Figure 6:
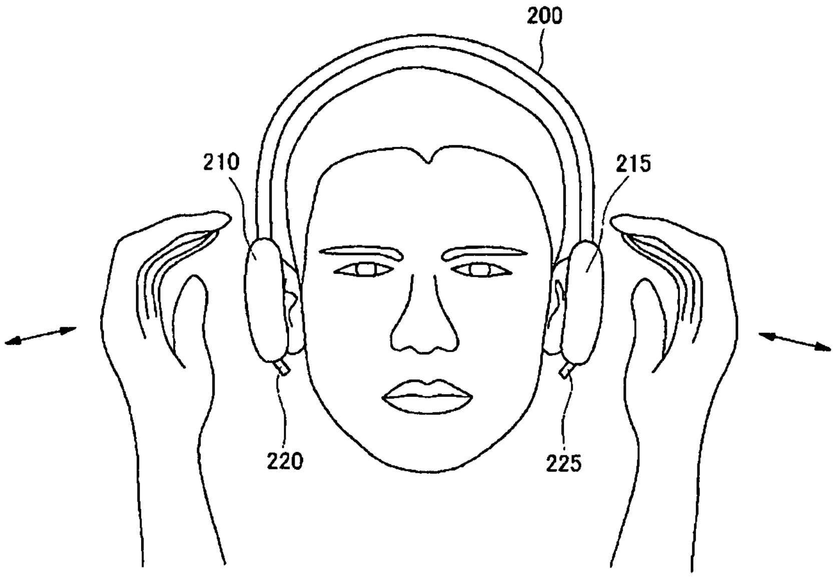
FIG. 6 shows an illustrative example of a user varying a first echo signal and a second echo signal.

FIG. 6 shows an illustrative example of a user varying a first echo signal and a second echo signal in accordance with one or more embodiments of an audio control system. As depicted in FIG. 6, a user of audio control system 200 may place or wear audio control system 200 on both ears and vary the echo signals by placing at least one of his/her hands in the proximity of one or both speakers 210 and 215 of audio control system 200 to partially or completely cover audio control system 200. First filter 230, which provides a first echo signal 232, may be positioned in the vicinity of first speaker 210, while second filter 235, which provides a second echo signal 237, may be positioned in the vicinity of second speaker 215.

The user of audio control system 200 may vary the first and/or second echo signals 232 and 237, respectively, by using one or both of his/her hands. For example, when the user moves his/her right hand closer to first speaker 210 and/or first microphone 220, the magnitude of the first echo signal increases because the magnitude of a signal reflected by the user's right hand back to first microphone 220 increases. Alternatively, when the user moves his/her right hand further away from first speaker 210 and/or first microphone 220, the magnitude of the first echo signal decreases. Symmetrically, the magnitude of the second echo signal 237 may both increase and decrease based on the positioning of the user's left hand. Thus, the first and second echo signals 232 and 237 may be independently varied based on the individual positioning of the user's hands. In the example above, although it has been described that the first and second echo signals 232 and 237, respectively, may be varied by the movement of the user's hands, it will be apparent to those skilled in the art that the first and second echo signals may be varied by other means, as described above with reference to FIG. 2.

Figure 7:
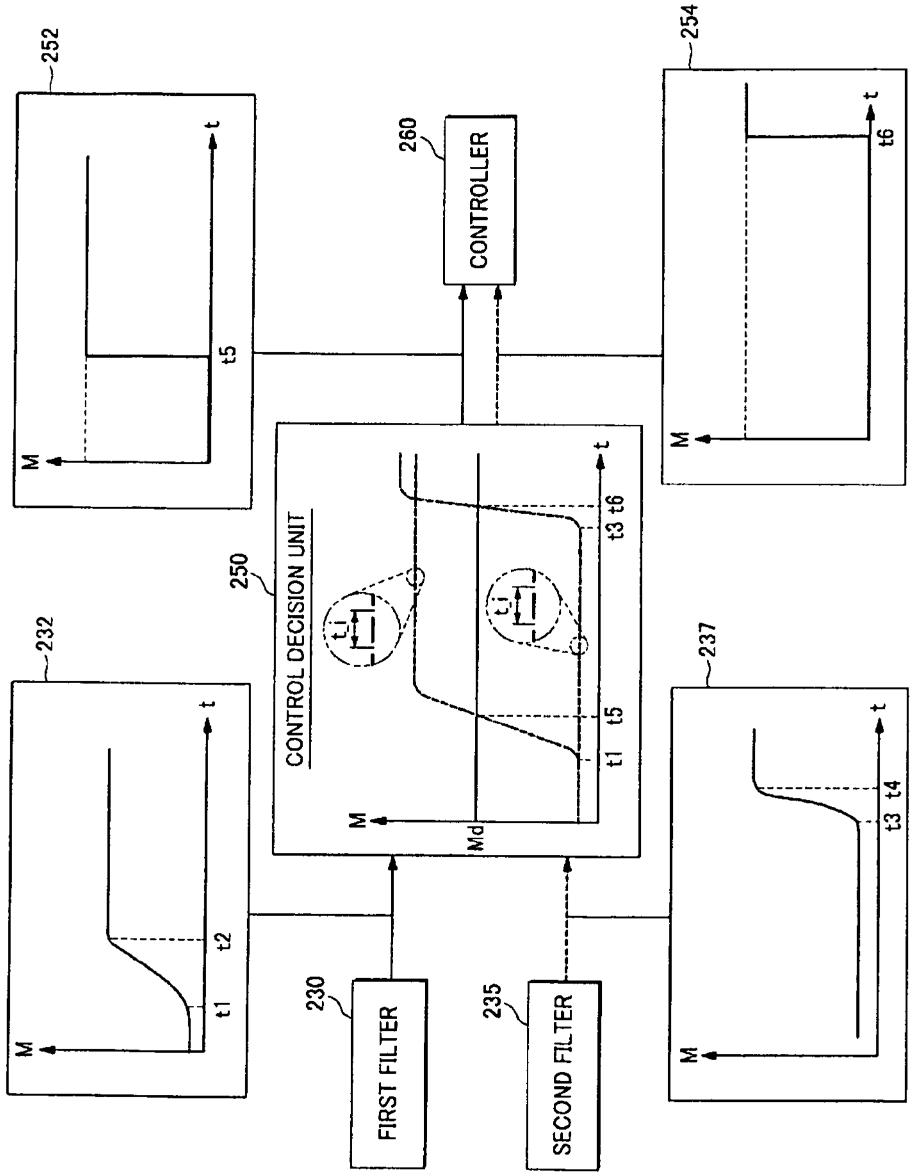
FIG. 7 shows an illustrative example of echo signals provided by a first filter and a second filter and control signals provided by a control decision unit.

FIG. 7 shows an example of the echo signals 232 and 237 provided by first filter 230 and second filter 235 and control signals 252 and 257 provided by control decision unit 250 in accordance with at least some embodiments described herein.

As depicted in FIG. 7, control decision unit 250 provides, to controller 260, a first control signal 252 based on a first echo signal 232 received from first filter 230 and a second control signal 257 based on a second echo signal 237 received from second filter 235. As discussed above with reference to FIG. 5, first and second echo signals 232 and 237, respectively, may be varied by various means including, but not limited to, the positioning of the user's hands around components of audio control system 200. In the example of FIG. 7, at time t1, the user's right hand may be positioned sufficiently close to first speaker 210 and/or first microphone 220 to generate a first echo signal 232. Subsequently, the magnitude of the first echo signal 232 may increase as the user's right hand moves closer to first speaker 210 and/or first microphone 220 until time t2, at which point the user's right hand may completely cover first speaker 210 and/or first microphone 220. After that, the user's left hand may be positioned sufficiently close to second speaker 215 and/or second microphone 225 to generate an echo signal 237 generated at time t3. Subsequently, the magnitude of the second echo signal 237 may increase as the user's left hand moves closer to second speaker 215 and/or second microphone 225 until time t4, at which point the user's left hand may completely cover second speaker 215 and/or second microphone 225.

As depicted in FIG. 7, control decision unit 250 may measure the average power of each of first and second echo signals 232 and 237 during a predetermined time interval of t_i. Each dot of the dotted line of the signal shown in the box representing control decision unit 250 represents the average power of each echo signal 232 and 237 during a predetermined time interval of t_i. For example, control decision unit 250 may compare each of the measured average powers of first echo signal 232 with a predetermined value of Md, and provide first control signal 252, based on the comparison result, to controller 260. Similarly, control decision unit 250 may compare each of the measured average powers of second echo signal 237 with the predetermined value of Md, and provide second control signal 257, based on the comparison result, to controller 260. First and second control signals 252 and 257 may each be provided as a binary signal representing two states, i.e., 1 and 0. As depicted in FIG. 7, the average power of first echo signal 232 may increase beyond the predetermined value of Md at time t5, and the average power of second echo signal 237 may increase beyond the predetermined value of Md at time t6. Accordingly, control decision unit 250 may output first control signal 252, which may vary from 0 to 1 at time t5 and second control signal 257, which may vary from 0 to 1 at time t6.

In the above example, although the control signals 252 and 257 are described as being based on the average power of the corresponding echo signals 232 and 237, respectively, the present disclosure is not limited thereto. In some embodiments, control decision unit 250 may measure the average magnitude of the corresponding echo signal during a predetermined time interval and compare the average magnitude with a predetermined value, as described with reference to FIG. 3.

FIG. 8 shows an illustrative example of controlling the operation of speakers according to a first control signal and a second control signal in accordance with at least some embodiments described herein.

As depicted in FIG. 8, controller 260 may control first and second speakers 210 and 215 to operate in various ways based on the first and second control signals 252 and 257. For example, when both of the first and second signals 252 and 257 are a one-bit binary signal, the first and second control signals 252 and 257 may be provided in four state permutations, and thus, controller 260 may provide four instructions which correspond to four operations, or functional features, of first and second speakers 210 and 215. The first sample operation may actually be no change of operation, the second operation may cause the volume to increase for both of first and second speakers 210 and 215, the third operation may cause the volume to decrease for both of first and second speakers 210 and 215, and the fourth operation may mute the volume of both first and second speakers 210 and 215. In some embodiments, both of the first and second control signals may be a two-bit binary signal, and the first and second control signals may exhibit 16 states (4×4) by combination thereof. In that case, controller 260 may provide 16 instructions which correspond to 16 operations of first and second speakers 210 and 215.

It will be apparent to those skilled in the art that controller 260 may control various operations of first and second speakers 210 and 215 beyond those described above. For example, controller 260 may change the audio signals, or audio files, output from the speakers 210 and 215, as described above with reference to audio control system 100 comprising one speaker and one microphone.

Figure 9:
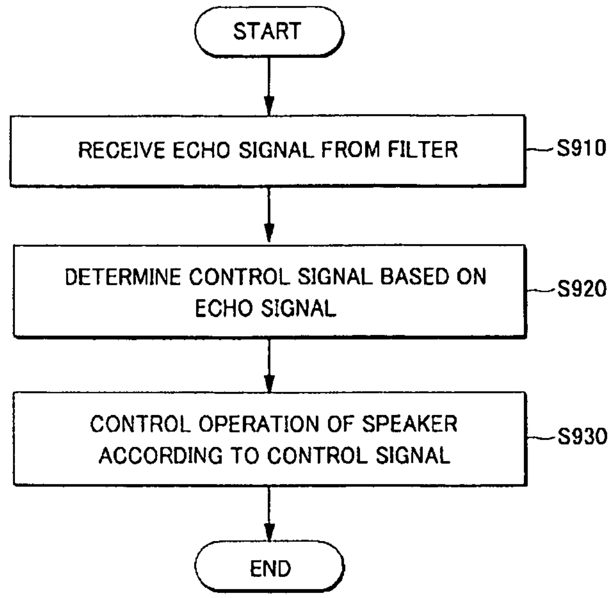
FIG. 9 shows a flow diagram of a method for controlling an audio control system.

FIG. 9 shows a flow diagram for a method for controlling an audio system in accordance with one or more of the embodiments described herein. The method in FIG. 9 may be implemented using, for example, the audio control systems 100 and 200 described above. The example method may include one or more operations, actions, or functions as illustrated by one or more of blocks S910, S920 and/or S930. Although illustrated as discrete blocks, various blocks may be divided into additional blocks, combined into fewer blocks, or eliminated altogether, depending on the desired implementation.

At block S910, an audio control system may be configured to receive an echo signal from a filter. The echo signal may be a signal generated based on a speaker sound detected by a microphone corresponding to the audio control system. The echo signal may be varied depending on, but not limited to, an arrangement of the speaker and the microphone, a distance between the speaker and the microphone, or the characteristics of the signal from the speaker. Further, the echo signal may also be varied by an object, including one or both of the user's hands, placed around the speaker and/or the microphone to partially or completely cover the speaker and/or the microphone.

At block S920, the audio control system may be configured to determine a control signal based on the echo signal. The average power of the echo signal may be measured during a predetermined time interval to determine the control signal. In some example embodiments, instead of the average power, the average magnitude of the echo signal may be measured during a predetermined time interval. For example, the measured average power of the echo signal may be compared with a single predetermined value to determine the control signal.

At block S930, the audio control system may be configured to control the operation of the speaker according to the control signal. For example, the volume of the speaker may be controlled according to the control signal. When the control signal is a binary signal related to two instructions, one instruction may be used to increase the volume of the speaker while the other used to decrease the volume of the speaker. In such a case, the control signal may adjust the volume of the speaker by a predetermined amount.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

In an illustrative embodiment, any of the operations, processes, etc. described herein can be implemented as computer-readable instructions stored on a computer-readable medium. The computer-readable instructions can be executed by a processor of a mobile unit, a network element, and/or any other computing device.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a CD, a DVD, a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An audio control system, comprising:

a filter configured to receive an audio signal from an audio player and to filter the received audio signal based on a filtering coefficient to provide an echo signal, wherein a magnitude of the echo signal is influenced by a proximity of a body part of a user of the audio control system to a speaker that is included as part of the audio control system and is mounted on a head portion of the user;

a control decision unit configured to provide a control signal based on at least one of the echo signal and the filtering coefficient and a controller configured to control a volume of the speaker, according to the control signal, to increase the volume of the speaker based on the magnitude of the echo signal being increased in proportion to the proximity of the body part of the user of the audio control system to the speaker until the body part of the user completely covers the speaker.

2. The audio control system of claim 1, wherein the controller is further configured to control at least one functional feature of the audio player according to the control signal.

3. The audio control system of claim 2, wherein the controller is further configured to select at least one audio file according to the control signal, and the audio player is further configured to play the at least one audio file.

4. The audio control system of claim 1, wherein the controller is further configured to control at least one functional feature of an external device according to the control signal.

5. The audio control system of claim 4, wherein the control signal is a wireless signal.

6. The audio control system of claim 1, wherein the filter is further configured to receive an echo-free signal from an echo-free signal generating unit and to update the filtering coefficient based on the echo-free signal.

7. The audio control system of claim 1, wherein the magnitude of the echo signal provided by the filter is influenced by a proximity of a hand of the user of the audio control system to the speaker.

8. The audio control system of claim 7, wherein the magnitude of the echo signal provided by the filter is influenced by a proximity of the speaker to a microphone that is included as part of the audio control system.

9. The audio control system of claim 7, wherein the speaker is a headphone speaker.

10. The audio control system of claim 1, wherein the control decision unit is further configured to measure an average power of the echo signal during a predetermined time interval.

11. The audio control system of claim 1, wherein the control decision unit is further configured to compare an average power of the echo signal with at least one predetermined value.

12. The audio control system of claim 1, wherein the control decision unit is further configured to measure an average magnitude of the echo signal during a predetermined time interval.

13. The audio control system of claim 12, wherein the control decision unit is further configured to compare the average magnitude of the echo signal with at least one predetermined value.

14. The audio control system of claim 1, wherein the control signal is a binary signal related to two instructions.

15. An audio control system, comprising:

a first filter configured to receive a first signal from a first speaker and to provide a first echo signal based on the received first signal;

a second filter configured to receive a second signal from a second speaker and to provide a second echo signal based on the received second signal;

a control decision unit configured to provide a first control signal based on the first echo signal and to provide a second control signal based on the second echo signal; and a controller configured to control at least one functional feature of the first speaker according to at least one of the first and second control signals and at least one functional feature of the second speaker according to at least one of the first and second control signals, wherein a magnitude of the first and second echo signals provided by the first and second filters, respectively, is influenced by a proximity of a body part of a user of the audio control system to the first and second speakers, respectively, that are mounted on a head portion of the user, wherein the controller is further configured to control a volume of the first and second speakers, according to at least one of the first and second control signals, to increase the volume of the first and second speakers based on at least one of the magnitude of the first and second echo signals being increased in proportion to the proximity of the body part of the user of the audio control system to the first and second speakers, respectively, until the body part of the user completely covers the at least one of the first and second speakers.

16. The audio control system of claim 15, wherein the magnitude of the first and second echo signals provided by the first and second filters, respectively, is influenced by a proximity of a hand of the user to the first and second speakers, respectively.

17. The audio control system of claim 15, wherein the magnitude of the first and second echo signals provided by the first and second filters is influenced by a proximity of the first and second speakers to a microphone that is included as part of the audio control system.

18. The audio control system of claim 15, wherein at least one of the first and second speakers is a headphone speaker.

19. The audio control system of claim 15, wherein the control decision unit is further configured to measure an average power of the first echo signal and an average power of the second echo signal during a predetermined time interval.

20. The audio control system of claim 15, wherein the control decision unit is further configured to measure an average magnitude of the first echo signal and an average magnitude of the second echo signal during a predetermined time interval.

21. The audio control system of claim 15, wherein:

the first control signal is a binary signal related to a first set of instructions configured to change the at least one functional feature of at least one of the first and second speakers, and the second control signal is a binary signal related to a second set of instructions configured to change the at least one functional feature of at least one of the first and second speakers.

22. The audio control system of claim 15, wherein the controller is further configured to select at least one audio file according to at least one of the first and second control signals, and the first and second speakers are further configured to play the at least one audio file.

23. A method performed under control of an audio control system, comprising:

receiving an echo signal from a filter;

determining a control signal based on a magnitude of the echo signal, wherein the magnitude of the echo signal is influenced by a proximity of a body part of a user of the audio control system to a speaker that is included as part of the audio control system and mounted on a head portion of the user; and controlling operation of the speaker according to the control signal, wherein the controlling comprises controlling a volume of the speaker, according to the control signal, to increase the volume of the speaker based on the magnitude of the echo signal being increased in proportion to the proximity of the body part of the user of the audio control system to the speaker, until the body part of the user completely covers the speaker.

24. The method of claim 23, wherein the determining includes:

measuring an average power of the echo signal during a predetermined time interval.

25. The method of claim 23, wherein the determining includes:

measuring an average magnitude of the echo signal during a predetermined time interval.

26. The method of claim 23, wherein:

the control signal is a binary signal related to two instructions, and the two instructions are configured to change the operation of the speaker.

27. The method of claim 23, wherein the controlling includes:

selecting at least one audio file according to the control signal.

28. The method of claim 23, wherein the magnitude of the echo signal received from the filter is influenced by a proximity of a hand of the user of the audio control system to the speaker.

29. The method of claim 23, wherein the magnitude of the echo signal received from the filter is influenced by a proximity of a hand of the user of the audio control system to a microphone that is included as part of the audio control system.

* * * * *